US011860210B2

(12) United States Patent
Du et al.

(10) Patent No.: US 11,860,210 B2
(45) Date of Patent: Jan. 2, 2024

(54) ELECTRICAL PHASE IDENTIFICATION USING A CLUSTERING ALGORITHM

(71) Applicant: Itron, Inc., Liberty Lake, WA (US)

(72) Inventors: Yingjuan Du, San Diego, CA (US); Brendan Stellarum, San Diego, CA (US)

(73) Assignee: Itron, Inc., Liberty Lake, WA (US)

( * ) Notice: Subject to any disclaimer, the term of this patent is extended or adjusted under 35 U.S.C. 154(b) by 0 days.

(21) Appl. No.: 17/732,505

(22) Filed: Apr. 28, 2022

(65) Prior Publication Data

US 2023/0100242 A1 Mar. 30, 2023

Related U.S. Application Data

(60) Provisional application No. 63/246,269, filed on Sep. 20, 2021.

(51) Int. Cl.
 *G01R 29/18* (2006.01)
 *H02J 13/00* (2006.01)
 (Continued)

(52) U.S. Cl.
 CPC ......... *G01R 29/18* (2013.01); *G01R 19/2513* (2013.01); *H02J 3/12* (2013.01); *H02J 13/00034* (2020.01)

(58) Field of Classification Search
 CPC .. G01R 29/18; G01R 19/2513; G01R 22/063; G01R 22/10; H02J 3/12; H02J 13/00034
 (Continued)

(56) References Cited

U.S. PATENT DOCUMENTS 11,258,855 B2\* 2/2022 Sterkel ................. H04L 67/303
2019/0041436 A1 2/2019 Kuloor et al.
(Continued)

OTHER PUBLICATIONS

Hosseini Zohreh Set al: "Machine Learning-Enabled Distribution Network Phase Identification", IEEE Transactions on Power Systems, IEEE, USA, vol. 36, No. 2, Jul. 22, 2020 (Jul. 22, 2020), pp. 842-850, XP011839326, ISSN: 0885-8950, DOI: 10.1109/TPWRS.2020.3011133 [retrieved on Feb. 18, 2021] the whole document.
(Continued)

*Primary Examiner* — Giovanni Astacio-Oquendo
(74) *Attorney, Agent, or Firm* — Lee & Hayes, P.C.

(57) ABSTRACT

A method, apparatus, and system for identifying electrical phases connected to electricity meters are disclosed. Voltage time series data of electricity meters are collected over a preselected collection time period, and three initial kernels representing three line-to-neutral phases are generated based on voltage correlations of meter-to-meter combinations. Three new kernels are then generated based on correlation values calculated for each of the three initial kernels with each electricity meter, and electricity meters are clustered into three groups based on average correlation values associated with each electricity meter. Six new kernels representing six phases are then formed based on the average correlation value associated with each electricity meter, and a predicted phase is assigned to each electricity meter based on correlation values of the electricity meter with each of the six new kernels based on the voltage time series data.

20 Claims, 10 Drawing Sheets

(51) Int. Cl.
*G01R 19/25* (2006.01)
*H02J 3/12* (2006.01)

(58) Field of Classification Search
USPC .............................................. 324/66, 67, 500
See application file for complete search history.

(56) References Cited

U.S. PATENT DOCUMENTS

2020/0150309 A1* 5/2020 Dann ..................... G01R 22/10
2021/0265839 A1  8/2021 Davis
2021/0351614 A1* 11/2021 Borisov ................. G06Q 50/06

OTHER PUBLICATIONS

The PCT Search Report and Written Opinion dated Nov. 2, 2022 for PCT application No. PCT/US2022/036137, 13 pages.
Therrien Francis et al: "Assessment of Measurement-Based Phase Identification Methods", IEEE Open Access Journal of Power and Energy, IEEE, vol. 8, Mar. 22, 2021 (Mar. 22, 2021), pp. 128-137, XP011846957, DOI: 10.1109/OAJPE.2021.3067632 [retrieved on Mar. 29, 2021] the whole document.

* cited by examiner

ELECTRICAL PHASE IDENTIFICATION USING A CLUSTERING ALGORITHM

This patent application claims benefit of priority to U.S. provisional patent application Ser. No. 63/246,269, titled "ELECTRICAL PHASE IDENTIFICATION USING A CLUSTERING ALGORITHM", filed on Sep. 20, 2021, which is incorporated herein by reference.

TECHNICAL FIELD

The present disclosure generally relates to the field of phase-balancing, and more specifically to methods, apparatus, and system for providing phase identification for electricity meters connected to an electrical grid.

BACKGROUND

Phase-balancing, such as balancing the electrical load on each of three electrical phases, in an electrical grid is an important consideration for utility providers. Phase-balancing may be complicated if electrical utility company records are incorrect, which frequently happens, for example, when linemen move a customer's connection, i.e., the customer's electricity meter, from one phase to another to better balance the load, but fail to record their actions and update the phase information of the customer's meter. Poorly balanced load reduces operational efficiency, and increases the likelihood of equipment failure and delays power outage management.

An improved and/or correct understanding of the topology has many advantages for advanced metering infrastructure (AMI) having automated meter reading (AMR) and other features associated with smart electricity meters. Correct understanding of the phase of a meter can help to improve an understanding of the topology of the electrical grid.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items or features.

DETAILED DESCRIPTION

Systems and methods for identifying a phase connected to electricity meters are disclosed.

Electricity is generated in three phases, A, B, and C, and on each phase, voltage oscillates in a sine wave, for example, at 60 Hz. Each of three phases of electricity is transmitted on a separate power line and there may be a fourth line, N, a ground or neutral wire with no voltage on it. These lines interact with each other at transformers, or where power is consumed.

Figure 1:
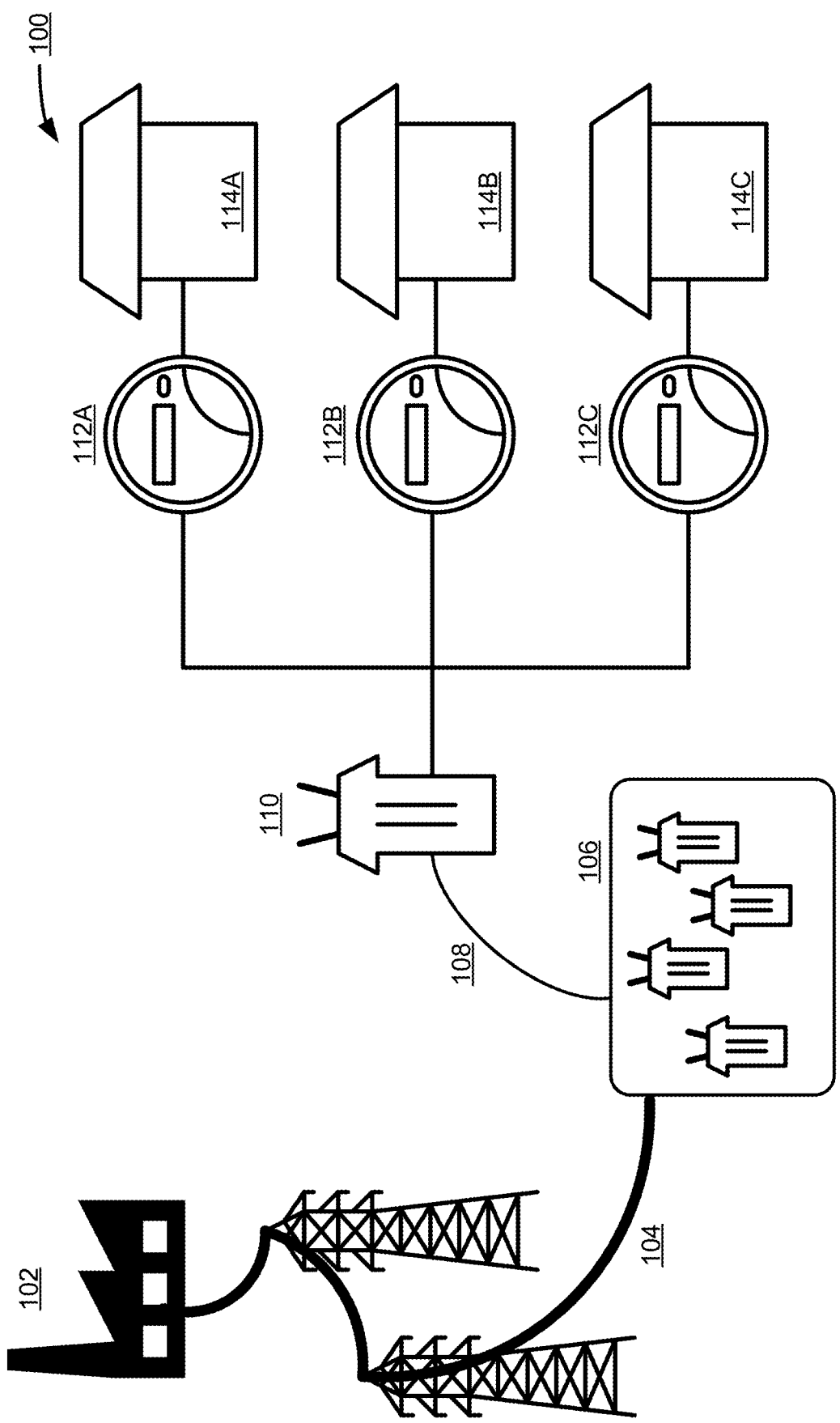
FIG. 1 illustrates an example power distribution environment.

FIG. 1 illustrates an example power distribution environment 100. In this example, a power plant 102 generates electricity, which is carried by high voltage lines 104 to a power substation 106. The power substation 106 provides electricity via a feeder 108 to a transformer 110. The feeder 108 is a power line consisting of individual powered lines with phase A, B, and C servicing a plurality of premises connected via the transformer 110 and electricity meters 112A, 112B, and 112C providing electricity to associated premises 114A, 114B, and 114C.

Figure 2:
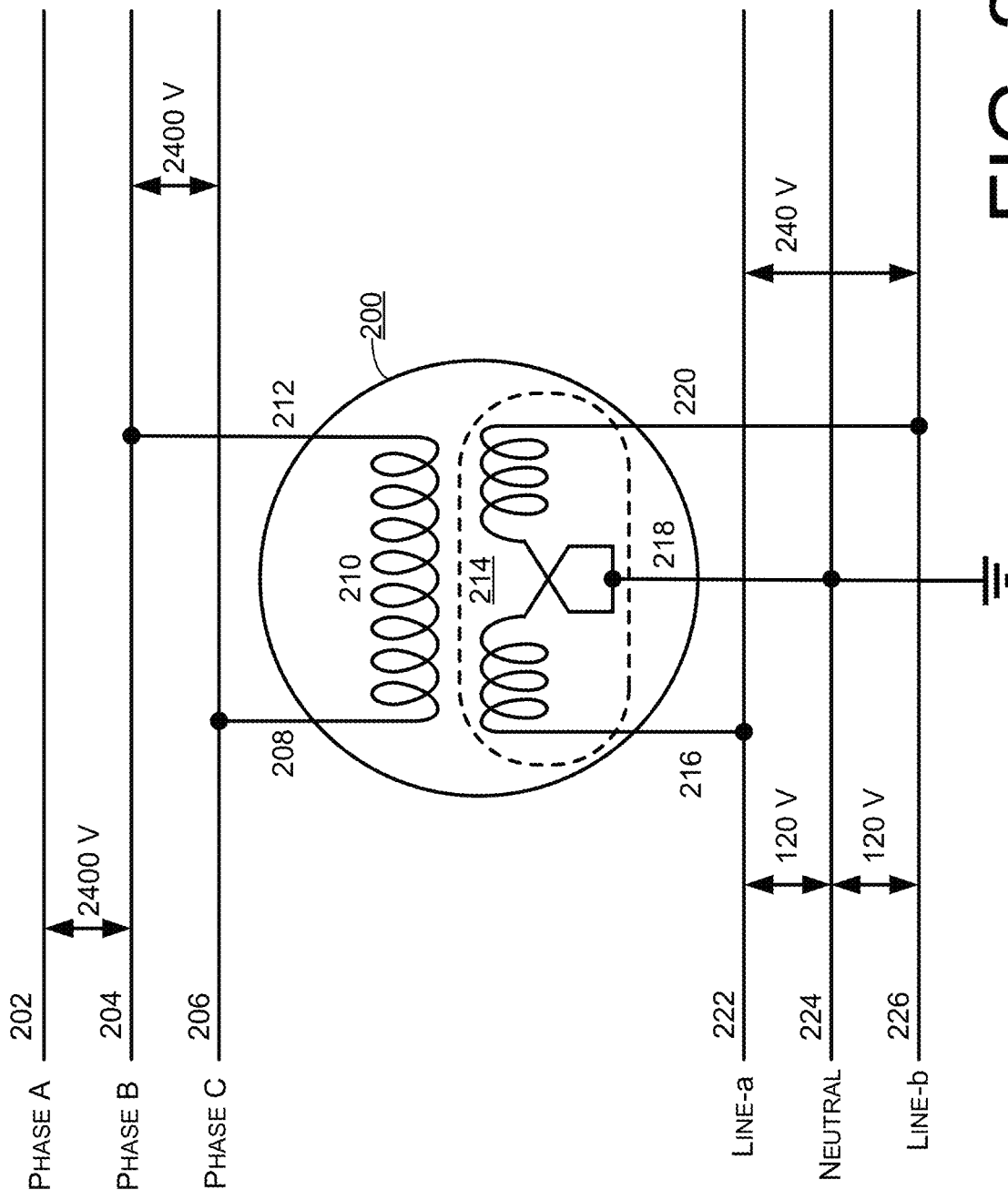
FIG. 2 illustrates a schematic diagram of an example transformer.

FIG. 2 illustrates a schematic diagram of an example transformer 200, such as a distribution transformer. Transformers are used to adjust voltage, and can be wired between a powered line and the neutral line, in which case, an output phase corresponds to the phase of the powered line. The transformers can also be wired between two powered lines, in which case, an output phase differs from all three powered lines and may be referred as a hybrid phase. Therefore, there are six possible phases at the metering level: Phase A-N(or A), Phase B-N (or B), Phase C-N(or C), Phase A-B, Phase B-C, and Phase A-C. In this example, Phases A, B, and C are shown as on lines 202, 204, and 206, respectively. In this example, there are 2400 V between Phases A 202 and B 204 and between Phases B 204 and C 206, and a first connection 208 of a primary winding 210 of the transformer 200 is connected to Phase C 206 and a second connection 212 of the primary winding 210 is connected to Phase B 204. A secondary winding 214 has three outputs, a first output 216, a second output, or a center tap, 218, and a third output 220, which are connected to a line-a 222, a neutral line 224, and a line-b 226, respectively. The transformer 200 in this example is a step-down transformer that reduces the voltage of the powered lines, in this case, Phases B 204 and C 206, from 2400 V to 120 V between the line-a 222 and the neutral 224 and between the line-b 226 and the neutral 224, and to 240 V between the line-a 222 and the line-b 226.

Figure 3:
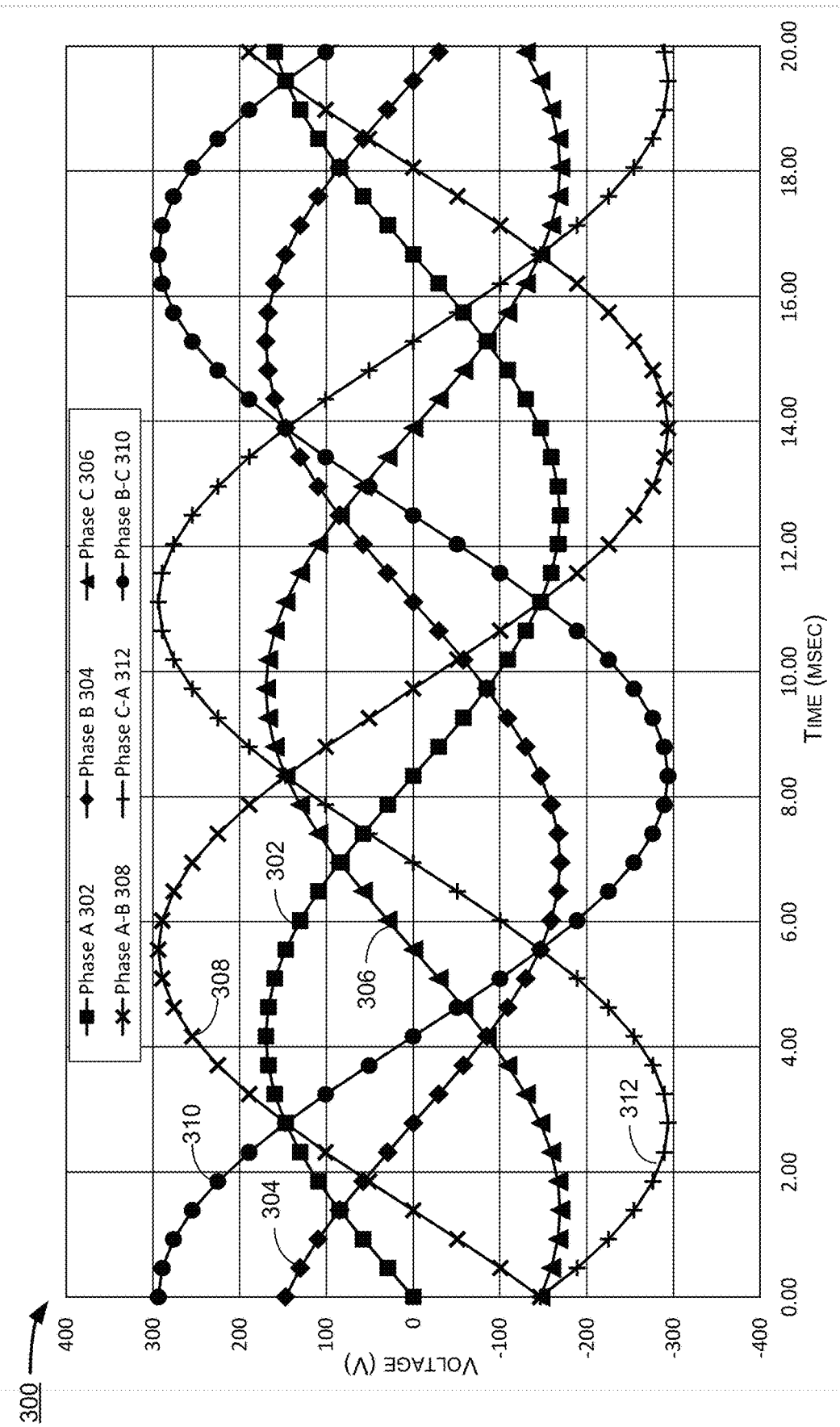
FIG. 3 illustrates an example set of voltage graphs for various phases.

FIG. 3 illustrates an example set of voltage graphs 300 for various phases. In this example, Phase A 302 is set as a reference, Phase B 304 is 120° ahead of Phase A 302, and Phase C 306 is 240° ahead of Phase A 302. Each phase has a voltage of 120 $V_{RMS}$ and a frequency of 60 Hz. Phase A-B 308, Phase B-C 310, and Phase C-A 312 are also shown. As shown, depending on the phase, the voltage behaves differently in magnitude over time. Poor phase balancing, such as overloading one phase, overloading equipment connected to a phase, or connecting to an incorrect phase, may cause operational inefficiency and equipment overheating, for example, increase in early equipment failure, delays in power outage response/management, and safety hazard.

Figure 4A:
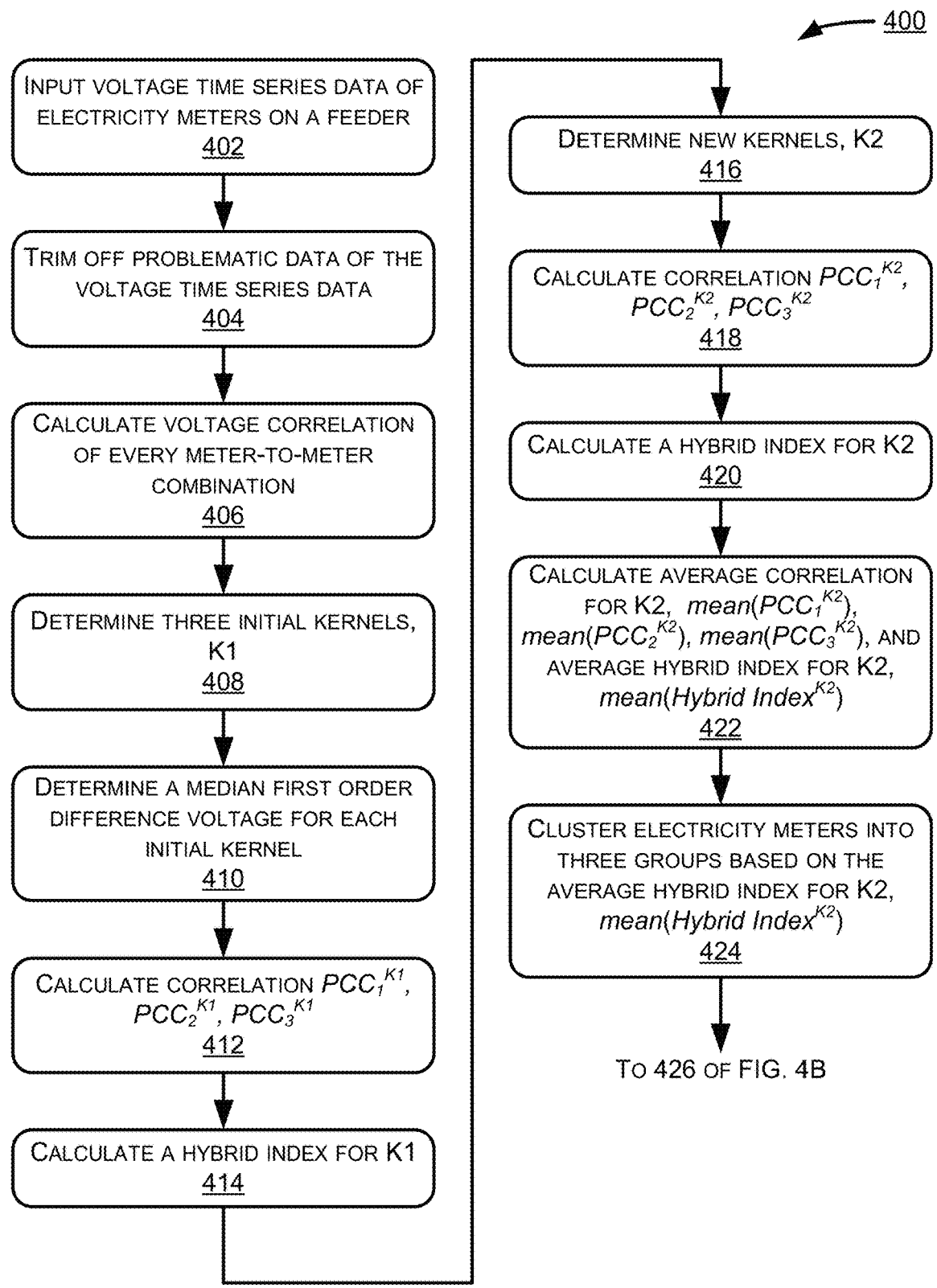
FIGS. 4A and 4B illustrate an example process for identifying a phase at an electricity meter level.
Figure 4B:
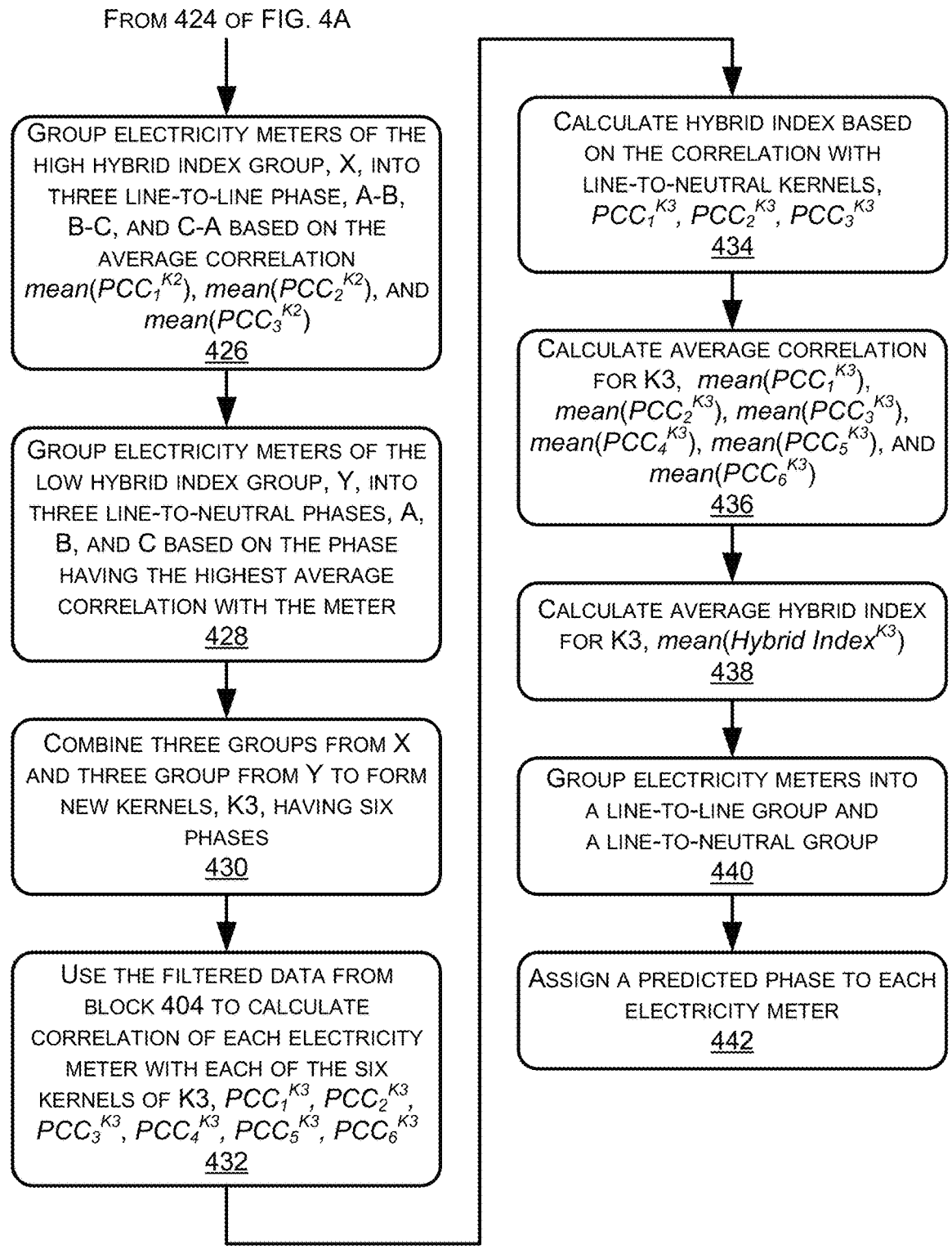

FIGS. 4A and 4B illustrate an example process 400 for identifying a phase at an electricity meter level.

At block 402, voltage time series data collected from every electricity meter on a feeder is entered. A feeder is a power line consisting of individual powered lines with phase A, B, and C servicing a plurality of premises connected via electricity meters. The distinct powered lines are presumed to experience different fluctuations in RMS voltage as a result of differing loads. Those fluctuations are expected be seen by all electricity meters connected to that line, and voltage readings on the same phase of the feeder are expected to be highly correlated compared to voltage readings on other phases. Accordingly, voltage readings collected from each electricity meter on the feeder over a preselected collection time period, such as from Jan. 1, 2020 to Dec. 31, 2020, may be entered as the voltage time series data. The voltage readings may be taken at a preselected interval, such as every five minutes with accuracy of ±0.15 V. With smart electricity meters in advanced metering infrastructure (AMI) having automated meter reading (AMR), the voltage time series data may be automatically transmitted from each electricity meter to, and collected by, a central office of the utility service provider or a third party. Additionally, an existing meter-phase connectivity record, which is the current record of information regarding each meter's connection to phase connections, may also be entered. As discussed above, the existing meter-phase connectivity record may not be up to date due to, for example, when linemen move a customer's electricity meter from one phase to another to better balance the load, but fail to record their actions and update the phase information of the customer's meter.

At block 404, the voltage time series data of each electricity meter for a preselected analysis period of the preselected collection time period, such as each month over Jan. 1, 2020 to Dec. 31, 2020, is filtered to omit problematic data or electricity meter. For example, expected average voltages (RMS) may be 120 V, 208 V, 240 V, 277 V, and 480 V for the feeder, then values that are more than ±5% out of the expected average voltages may be omitted. Frozen periods, identified as extended periods of time with constant voltage on a given meter, may be omitted. Jump outliers, identified as large interval-to-interval voltage changes outside of a preselected threshold, may be omitted. Electricity meters with insufficient amount of data over the collection time period may be omitted. Electricity meters having location information inconsistent with actual geographical locations of the electricity meters may be omitted, or the location information may be corrected and the voltage time series data of those electricity meters with the corrected location information may be used.

At block 406, voltage correlation of every meter-to-meter combination is calculated. In one example, the voltage correlation may be calculated using Pearson correlation coefficient (PCC) to determine the correlation between voltage at meter A and voltage at meter B, that is, how a change in voltage at meter A affects a change in voltage at meter B. Pearson correlation coefficient, $\rho$, has a value between −1 and 1, and is given by, for the correlation between X and Y:

$$\rho_{X,Y} = \frac{\text{cov}(X, Y)}{\sigma_X \sigma_Y},$$

where:
cov is the covariance,
$\sigma_X$ is the standard deviation of X, and
$\sigma_Y$ is the standard deviation of Y.
PCC may be calculated for every meter-to-meter pairing, and the results may be stored in a matrix.

At block 408, three initial kernels, K1 containing most of the electricity meters for Phases A, B, and C, is determined. For the process of block 408, an agglomerative cluster loop or method may be utilized to determine the three initial kernels. Examples of the agglomerative cluster method include analyses based on a single-linkage distance, Ward linkage distance, dendrogram step-through, and the like. Additionally, or alternatively, a Gaussian mixture model may be utilized to perform the clustering.

At block 410, a median first order difference voltage for each preselected interval is determined for each of the initial kernels. Correlation, $PCC_1^{K1}$, $PCC_2^{K1}$, and $PCC_3^{K1}$, with each of the three initial kernel for each meter are calculated at block 412. At block 414, a hybrid index for the three initial kernels may be calculated based on a median of the correlations, $PCC_1^{K1}$, $PCC_2^{K1}$, and $PCC_3^{K1}$. The hybrid index may be defined as the ratio of the second highest (median) correlation to the highest correlation, $$\text{Hybrid Index}^{K1} = \frac{\text{median}(PCC_1^{K1}, PCC_2^{K1}, PCC_3^{K1})}{\max(PCC_1^{K1}, PCC_2^{K1}, PCC_3^{K1})}.$$

Alternatively, the hybrid index may also be defined, or calculated as:

$$\text{alt\_Hybrid Index}^{K1} = \left\{ \frac{[-PCC_1^{K1} + PCC_2^{K1}]^2}{2} + \frac{[PCC_1^{K1} + PCC_2^{K1} - 2*PCC_3^{K1}]^2}{6} \right\}^{1/2}.$$

The hybrid index is used to separate out the line-to-line connections from the line-to-neutral connections as described later in more detail. Based on the Hybrid Index$^{K1}$, new kernels for each phase, K2, are determined at block 416. The correlation between each of the electricity meters and the new kernels, $PCC_1^{K1}$, $PCC_2^{K2}$, and $PCC_3^{K2}$, are calculated at block 418, and Hybrid Index$^{K2}$ is calculated at block 420.

At block 422, for each preselected analysis period, average correlation with each phase for the new kernels, K2, mean($PCC_1^{K2}$), mean($PCC_2^{K2}$), and mean($PCC_3^{K2}$), and average hybrid index for K2, mean(Hybrid Index K2), are calculated. The electricity meters are then clustered into three groups based on the average hybrid index for K2, mean(Hybrid Index$^{K2}$) at block 424. The three groups include a group with a high hybrid index, which is considered to be the line-to-line phase group, a group with low hybrid index, which is considered to be line-to-neutral phase group, and a group with in-between hybrid index values is used as a band separating the high and low hybrid index groups. At block 426, the electricity meters of the high hybrid index group, X, are grouped into three line-to-line phases, A-B, B-C, and C-A, based on the average correlation, mean($PCC_1^{K2}$), mean($PCC_2^{K2}$), and mean($PCC_3^{K2}$). For the clustering processes of blocks 424 and 426, the agglomerative cluster method as described above may be utilized.

At block 428, the electricity meters of the low hybrid index group, Y, are grouped into three line-to-neutral phases, A, B, and C, based on the phase having the highest average correlation, mean($PCC_1^{K2}$), mean($PCC_2^{K2}$), and mean($PCC_3^{K2}$) with the meter. The three line-to-line groups of electricity meters and the three line-to-neutral groups of electricity meters are combined as new kernels, K3, having six phases, A, B, C, A-B, B-C, and C-A, at block 430.

At block 432, the filtered data from block 404 is used to calculate correlation of each electricity meter with each of the six kernels of K3, $PCC_1^{K3}$, $PCC_2^{K3}$, $PCC_3^{K3}$, $PCC_4^{K3}$, $PCC_5^{K3}$, and $PCC_6^{K3}$, and hybrid index based on the correlation with line-to-neutral kernels, $PCC_1^{K3}$, $PCC_2^{K3}$, and $PCC_3^{K3}$, is calculated at block 434. At block 436, average correlation with each of six phases are calculated as mean ($PCC_i^{K3}$), for i=1, 2, 3, 4, 5, 6, where i represents each of the six phases, A, B, C, A-B, B-C, and C-A. At block 438, an average hybrid index, mean(Hybrid Index$^{K3}$) is calculated. The electricity meters are grouped into two groups, a line-to-line group and a line-to-neutral group at block 440. The agglomerative cluster method described above may be utilized to group electricity meters with a high average hybrid index into the line-to-line group and electricity meters with a low average hybrid index into the line-to-neutral group. A predicted phase is assigned to each meter based on the highest correlation at block 442. For the line-to-line group, the predicted phase is the one with a highest correlation in mean($PCC_i^{K3}$), for i=4, 5, 6, and for the line-to-neutral group, the predicted phase is the one with a highest correlation in mean($PCC_i^{K3}$), for i=1, 2, 3. The predicted phase may then be output for comparison with the existing meter-phase connectivity record.

Figure 5:
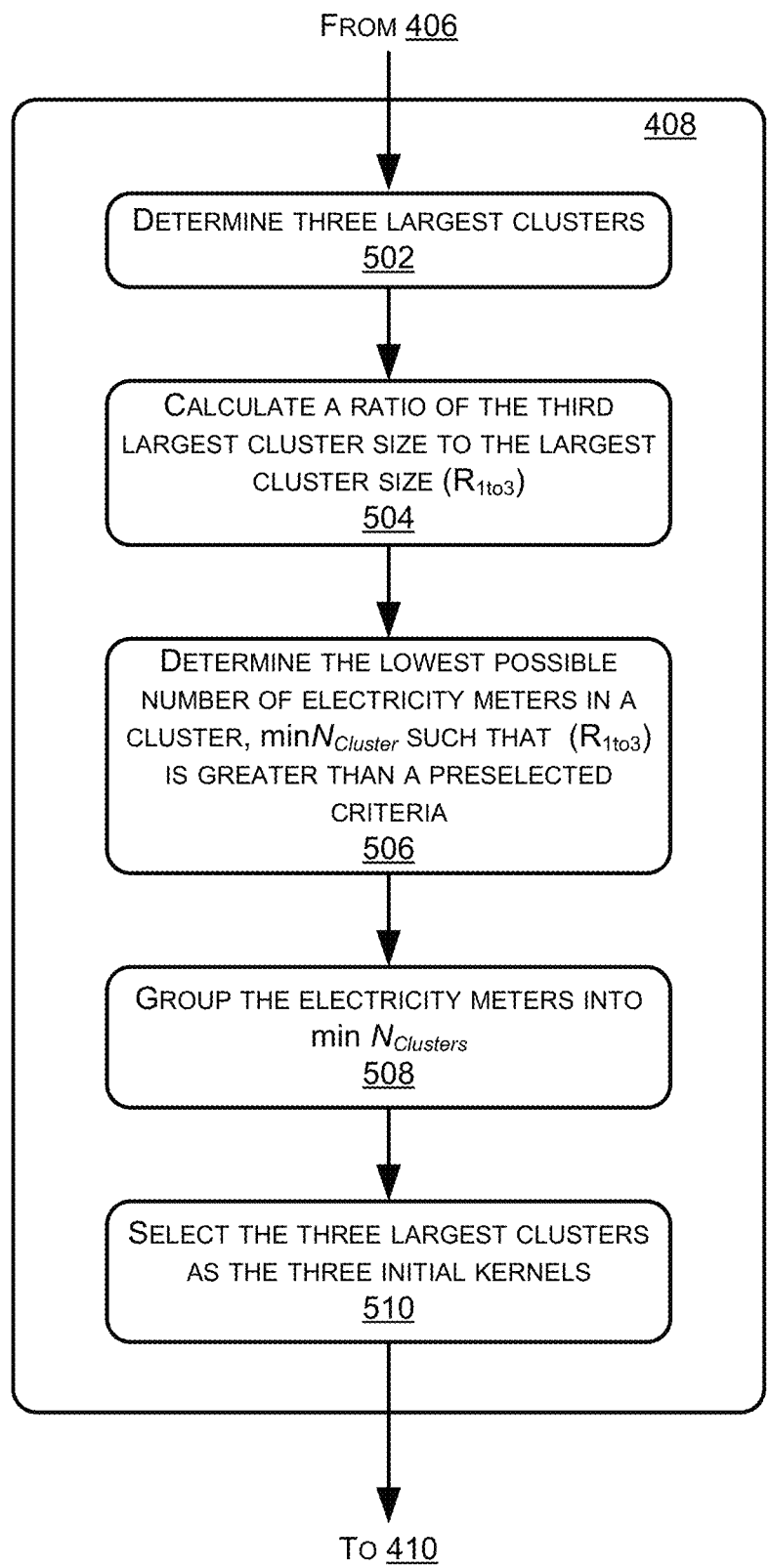
FIG. 5 illustrates an example detail process of one of the blocks of FIG. 4.

FIG. 5 illustrates an example detail process of block 408 of FIG. 4.

At block 502, three largest clusters of electricity meters are determined. For all possible number of clusters from three to the number of meters in the sample, the largest three clusters, from large to small, L1, L2, and L3 are determined. At block 504, a ratio of the third largest cluster size to the largest cluster size, $$R_{1to3} = \frac{size_{L3}}{size_{L1}},$$

is calculated. At block 506, the lowest possible number of clusters, min $N_{Clusters}$, such that $R_{1to3}$ is greater than a preselected criteria, is determined, which ensures that the three initial kernels obtained are not too imbalanced. For example, for the preselected criteria of 0.5, the largest cluster is no larger than twice the size of the smallest cluster. At block 508, the agglomerative cluster method may be utilized to group the electricity meters into the min $N_{Clusters}$ calculated in block 506. At block 510, the three largest clusters are selected as the three initial kernels, and the process proceeds to block 410.

Figure 6:
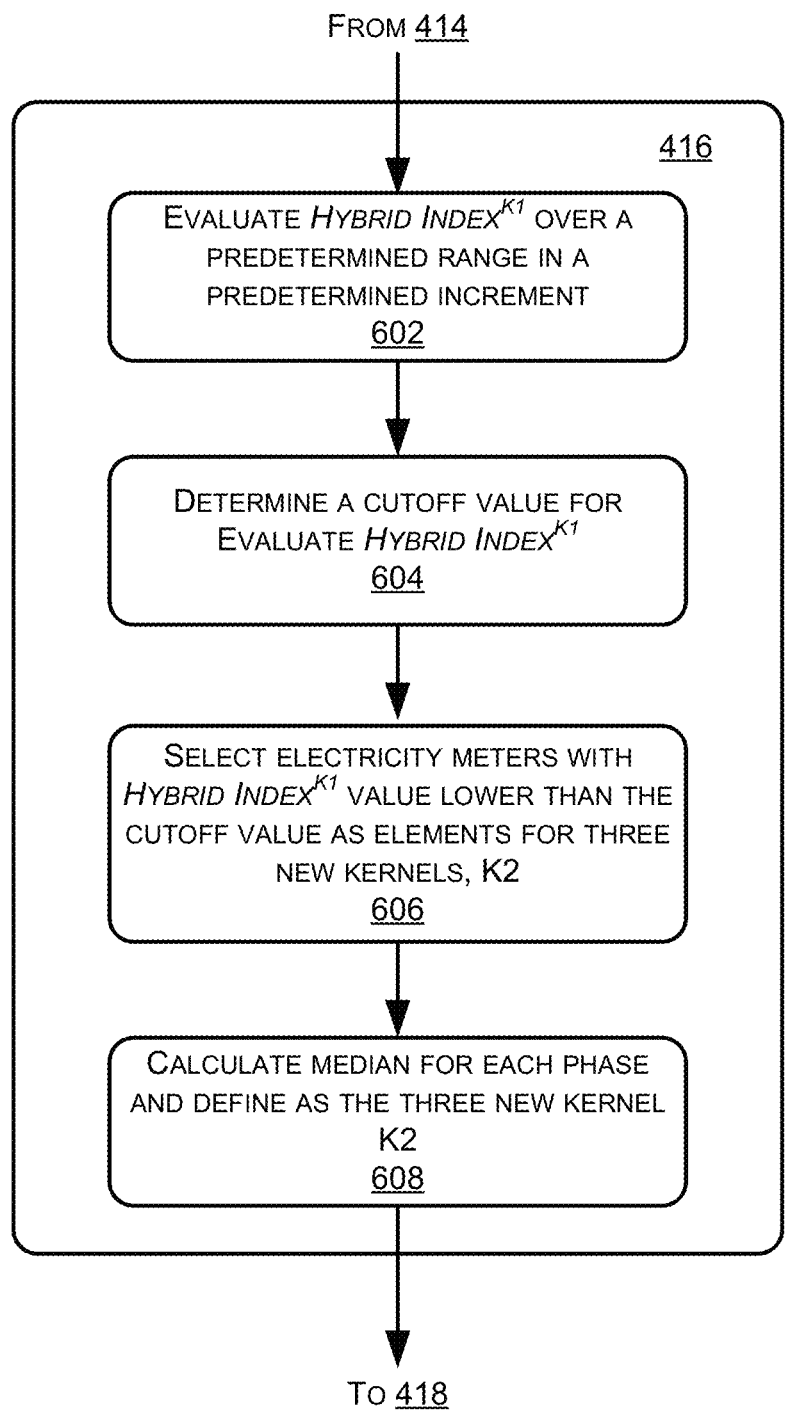
FIG. 6 illustrates an example detail process of another block of the blocks of FIG. 4.

FIG. 6 illustrates an example detail process of block 416 of FIG. 4.

At block 602, a predetermined range, for example from 0.75 to 0.85, of Hybrid Index$^{K1}$ is evaluated in a predetermined increment, for example, 0.01, and a cutoff value of Hybrid Index$^{K1}$ is determined at block 604. The cutoff value of Hybrid Index$^{K1}$ may be defined as a value of Hybrid Index$^{K1}$ below which there exist a first sufficient number of electricity meters for each phase and, above which there exist a second sufficient number of electricity meters, where the first and second sufficient numbers may be preselected. At block 606, electricity meters with Hybrid Index$^{K1}$ value lower than the cutoff value are selected as the elements for three new kernels, K2, and median of each phase is calculated and defined as three new kernels, K2, at block 608. The process then proceeds to block 418.

Figure 7A:
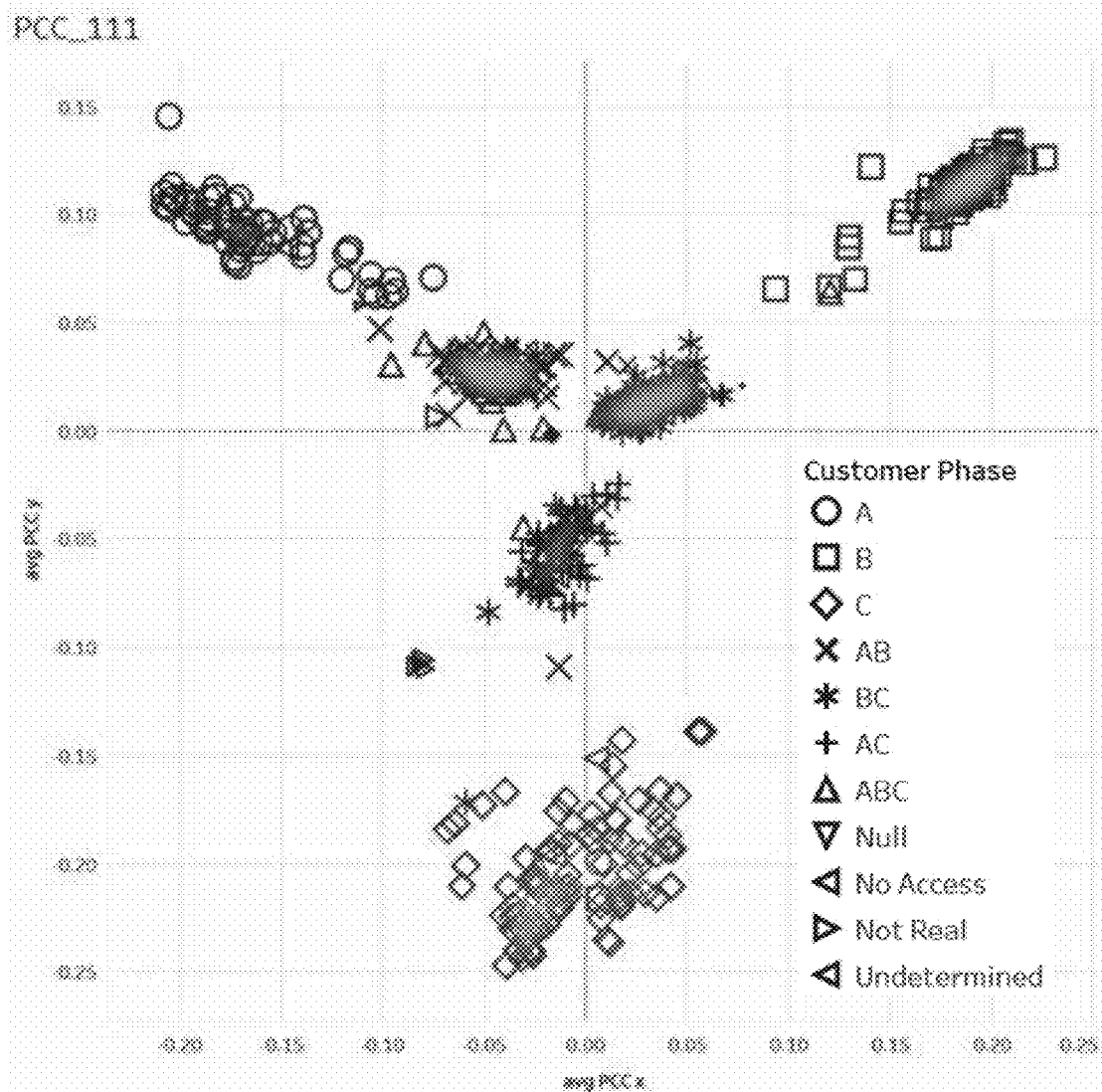
FIG. 7A illustrates an example display of the clusters of electricity meters.
Figure 7A:
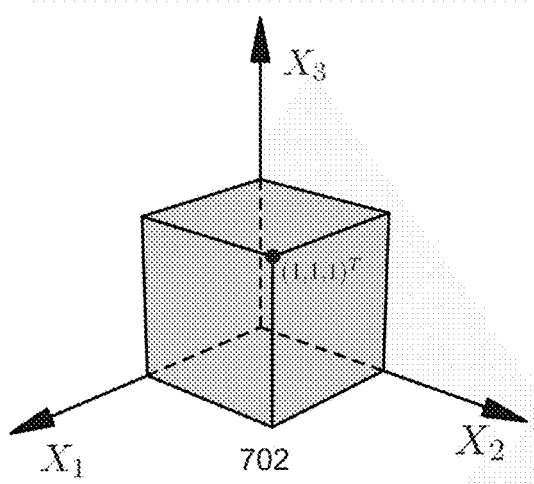
Figure 7B:
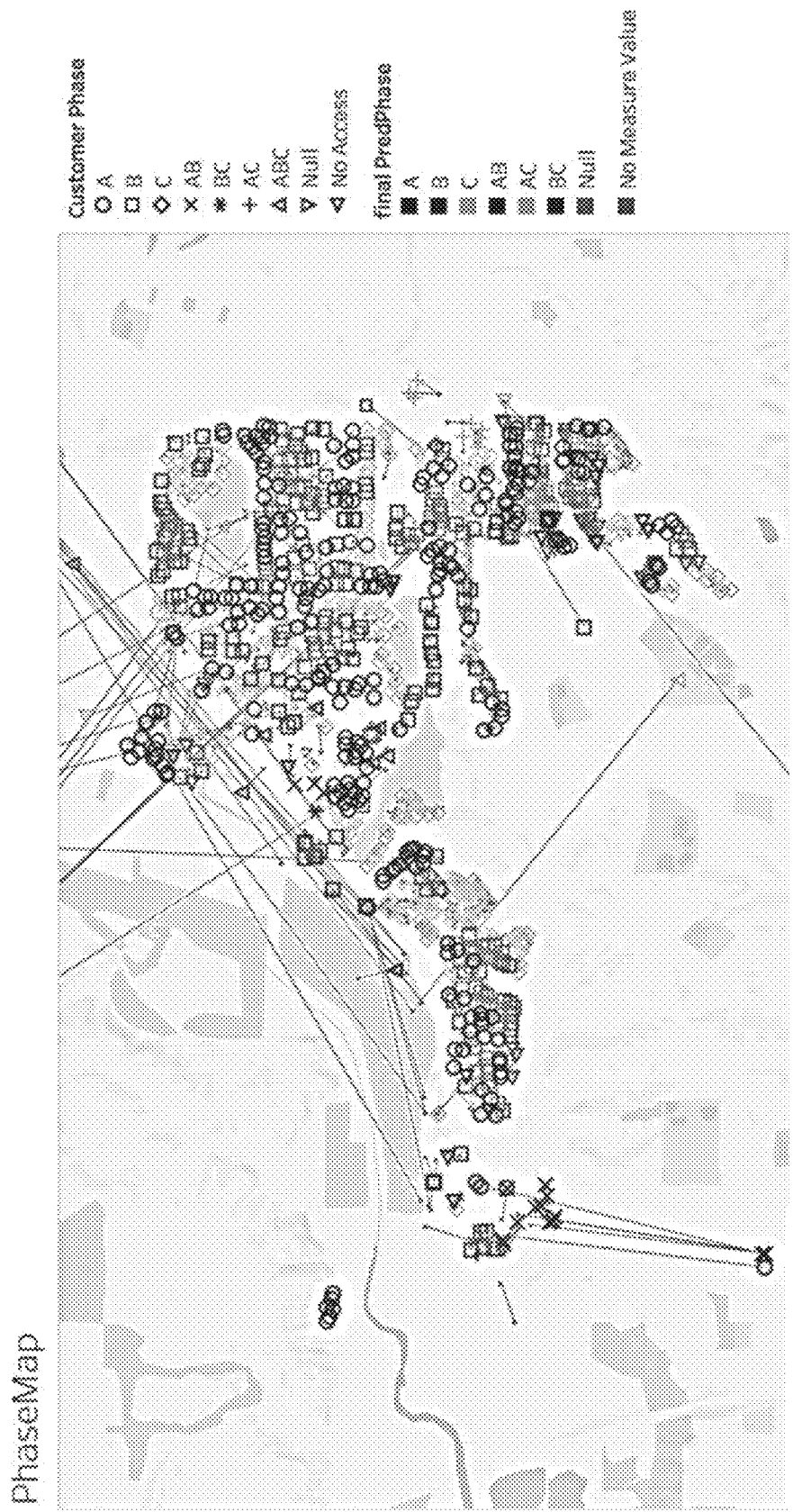
FIG. 7B illustrates example display of a phase map of the electricity meters of FIG. 7A.

FIG. 7A illustrates an example display 700 of the clusters of electricity meters. Clusters of electricity meters may be displayed when each meter is plotted in 3D coordinates based on its correlation to phases A, B and C. The display 700 is a 2D view of the 3D plot viewed from the point (1,1,1) facing the origin (0,0,0) as shown by a graphical representation 702. FIG. 7B illustrates an example display 704 of phases of the electricity meters of FIG. 7A plotted over the locations of the electricity meters on a map.

Figure 8:
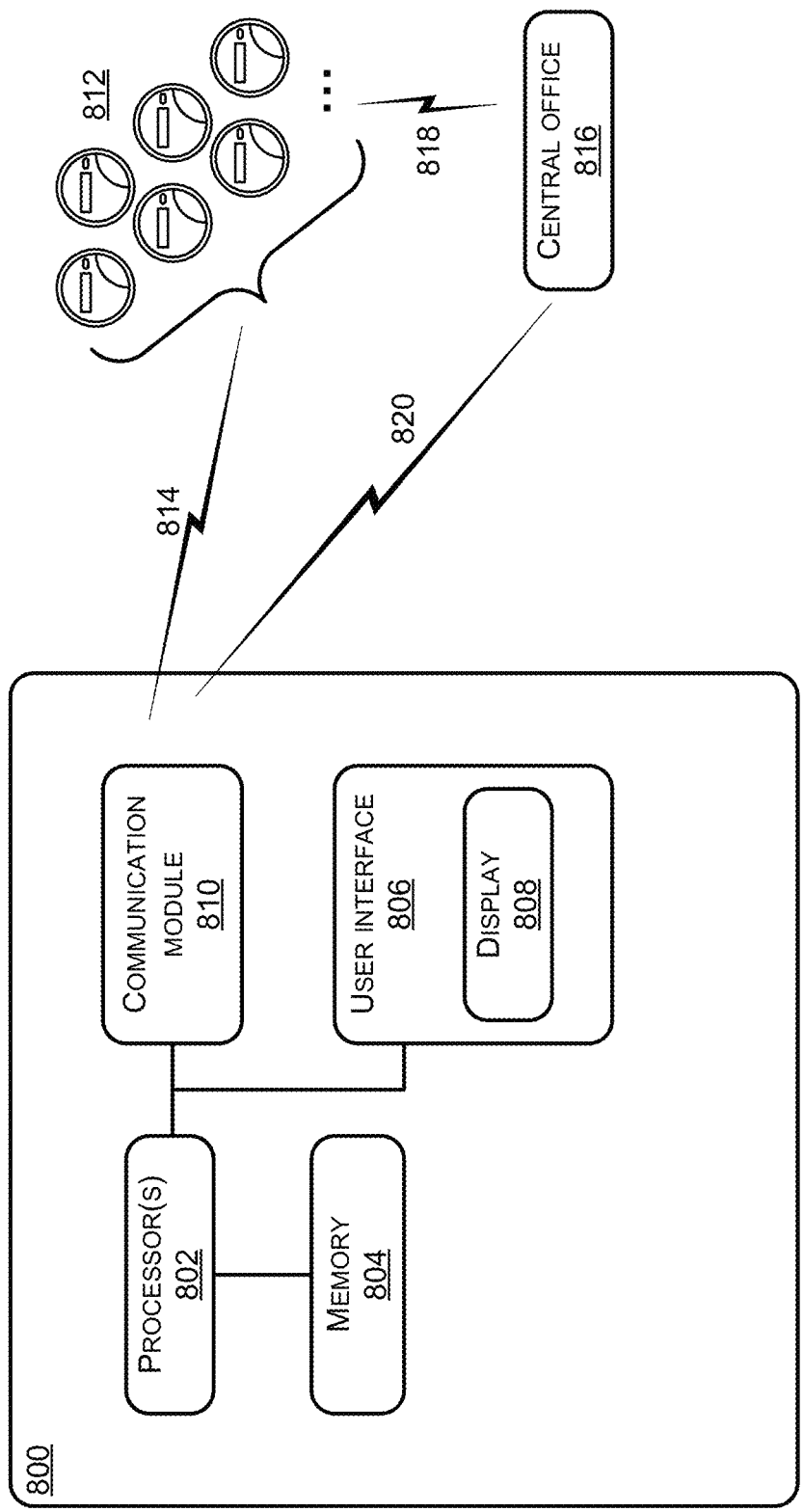
FIG. 8 illustrates an example block diagram of a system for identifying electrical phase.

FIG. 8 illustrates an example block diagram of a system 800 for identifying electrical phase.

The system 800 may comprise one or more processors (processors) 802 communicatively coupled to memory 804. The processors 802 may include one or more central processing units (CPUs), graphics processing units (GPUs), both CPUs and GPUs, or other processing units or components known in the art. The processors 802 may execute computer-executable instructions stored in the memory 804 to perform functions or operations, with one or more of components communicatively coupled to the one or more processors 802 and the memory 804, as described above with reference to FIGS. 4-7. For example, the memory 804 may store a phase analysis application 806 that is executed for analyzing the phases as described above with reference to FIGS. 4-7. Depending on the exact configuration of the system 800, the memory 804 may be volatile, such as RAM, non-volatile, such as ROM, flash memory, miniature hard drive, memory card, and the like, or some combination thereof. The memory 804 may store computer-executable instructions that are executable by the processors 802.

The components of the system 800 coupled to the processors 802 and the memory 804 may comprise a user interface (UI) 806, including a display 808, and a communication module 810. The communication module 810 may communicate with a plurality of electricity meters 812 to receive the voltage time series data collected as discussed above with reference to FIGS. 4-6, as indicated by an arrow 814. Additionally, or alternatively, the electricity meters 812 may communicate with a central office 816 of the utility provider, or a third party, as shown by an arrow 818, and the central office 816 may collect the voltage time series data. The central office 816 may communicate the collected voltage time series data to the communication module 810 as shown by an arrow 820. While the communications 814, 818, and 820 between the communication module 810 and the electricity meters 812, the electricity meters 812 and the central office 816, and the central office 816 and the communication module 810, respectively, are shown as wireless communications, the communications 814, 818, and 820 may be established in various ways, such as via a cellular network, Wi-Fi network, cable network, landline telephone network, and the like.

While not shown, each of the electricity meters 812 may comprise one or more processors, memory coupled to the processors, a metrology module coupled to the processors, and a communication module coupled to the processors. The processors may include one or more central processing units (CPUs), graphics processing units (GPUs), both CPUs and GPUs, or other processing units or components known in the art. The processors may execute computer-executable instructions stored in the memory to perform functions or operations with one or more of components communicatively coupled to the one or more processors and the memory, such as measuring the voltage and storing voltage time series data in the memory or transmitting to the central office 816 or to the communication module 810 of the system 800.

Depending on the exact configuration of the electricity meter 812, the memory may be volatile, such as RAM, non-volatile, such as ROM, flash memory, miniature hard drive, memory card, and the like, or some combination thereof. The memory may store computer-executable instructions that are executable by the processors. The electricity meter 812 may receive instructions from the central office 816 regarding the preselected collection time period and the preselected interval, for example, changing the collection time period to two years and the interval to two minutes.

Some or all operations of the methods described above can be performed by execution of computer-readable instructions stored on a computer-readable storage medium, as defined below. The terms "computer-readable medium," "computer-readable instructions," and "computer executable instruction" as used in the description and claims, include routines, applications, application modules, program modules, programs, components, data structures, algorithms, and the like. Computer-readable and -executable instructions can be implemented on various system configurations, including single-processor or multiprocessor systems, minicomputers, mainframe computers, personal computers, hand-held computing devices, microprocessor-based, programmable consumer electronics, combinations thereof, and the like.

The computer-readable storage media may include volatile memory (such as random-access memory (RAM)) and/or non-volatile memory (such as read-only memory (ROM), flash memory, etc.). The computer-readable storage media may also include additional removable storage and/or non-removable storage including, but not limited to, flash memory, magnetic storage, optical storage, and/or tape storage that may provide non-volatile storage of computer-readable instructions, data structures, program modules, and the like.

A non-transitory computer-readable storage medium is an example of computer-readable media. Computer-readable media includes at least two types of computer-readable media, namely computer-readable storage media and communications media. Computer-readable storage media includes volatile and non-volatile, removable and non-removable media implemented in any process or technology for storage of information such as computer-readable instructions, data structures, program modules, or other data. Computer-readable storage media includes, but is not limited to, phase change memory (PRAM), static random-access memory (SRAM), dynamic random-access memory (DRAM), other types of random-access memory (RAM), read-only memory (ROM), electrically erasable programmable read-only memory (EEPROM), flash memory or other memory technology, compact disk read-only memory (CD-ROM), digital versatile disks (DVD) or other optical storage, magnetic cassettes, magnetic tape, magnetic disk storage or other magnetic storage devices, or any other non-transmission medium that can be used to store information for access by a computing device. In contrast, communication media may embody computer-readable instructions, data structures, program modules, or other data in a modulated data signal, such as a carrier wave, or other transmission mechanism. As defined herein, computer-readable storage media do not include signals such as communication media.

The computer-readable instructions stored on one or more non-transitory computer-readable storage media, when executed by one or more processors, may perform operations described above with reference to FIGS. 4-7. Generally, computer-readable instructions include routines, programs, objects, components, data structures, and the like that perform particular functions or implement particular abstract data types. The order in which the operations are described is not intended to be construed as a limitation, and any number of the described operations can be combined in any order and/or in parallel to implement the processes.

CONCLUSION

Although the subject matter has been described in language specific to structural features and/or methodological acts, it is to be understood that the subject matter defined in the appended claims is not necessarily limited to the specific features or acts described. Rather, the specific features and acts are disclosed as exemplary forms of implementing the claims.

What is claimed is:

1. A method comprising:
   calculating voltage correlations of meter-to-meter combinations of a plurality of electricity meters based on voltage time series data collected over a preselected collection time period, each electricity meter of the plurality of electricity meters connected to one of six phases comprising three line-to-neutral phases and three line-to-line phases;
   clustering the plurality of electricity meters into three initial kernels representing the three line-to-neutral phases based on voltage correlations;
   for each of the three initial kernels, calculating correlation values with each electricity meter of the plurality of electricity meters;
   determining three new kernels based on the correlation values;
   clustering the plurality of electricity meters into three groups based on a hybrid index for the three new kernels calculated based on average correlation values associated with each electricity meter;
   forming six new kernels of electricity meters representing the six phases based on the average correlation values associated with each electricity meter; and
   assigning a predicted phase to an electricity meter of the plurality of electricity meters based on corresponding correlation values of the electricity meter with each of the six new kernels based on the voltage time series data.

2. The method of claim 1, wherein the voltage time series data is, at least one of:
   collected by the plurality of electricity meters,
   stored by the plurality of electricity meters,
   transmitted by the plurality of electricity meters to, and stored by, a central office of a utility service provider, or
   obtained from the central office.

3. The method of claim 1, wherein the voltage time series data includes a preselected analysis period of voltage data associated with an electricity meter of the plurality of electricity meters taken over a preselected collection time period at a preselected interval.

4. The method of claim 1, further comprising, prior to calculating the voltage correlations of meter-to-meter combinations:
   omitting problematic data of the voltage time series data, wherein the problematic data include:
      voltage values deviating more than a preselected value from an expected average value,
      constant voltage over longer than a predetermined period,
      missing data over more than a preselected number of preselected intervals, and
      data from an electricity meter having location information inconsistent with an actual geographical location of the electricity meter.

5. The method of claim 1, wherein clustering the plurality of electricity meters into the three initial kernels comprises:

determining three largest clusters of electricity meters for all clusters having at least three electricity meters and up to all electricity meters of the plurality of electricity meters;

determining a ratio of a third largest cluster size of the three largest clusters to a largest cluster size of the three largest clusters;

determining a lowest number of clusters, such that the ratio is greater than a preselected criteria;

grouping the plurality of electricity meters into the lowest number of clusters; and selecting three largest clusters as the three initial kernels.

6. The method of claim 1, wherein determining the three new kernels based on the correlation values comprises:

evaluating hybrid index values of a predetermined range for the three initial kernels, a hybrid index value calculated as a ratio of a median correlation value of the three initial kernels to a maximum correlation value of the three initial kernels;

determining a cutoff value of the hybrid index below which there are more than a first preselected number of electricity meters for each phase and above which there are more than a second preselected number of electricity meters; and selecting electricity meters with hybrid index values below the cutoff value as elements for the three new kernels.

7. The method of claim 1, wherein clustering the plurality of electricity meters into three groups comprises:

clustering a group of electricity meters with a high hybrid index as a line-to-line phase group, clustering electricity meters with a low hybrid index as a line-to-neutral phase group, and clustering electricity meters with in-between hybrid index values as a band separating the high and low hybrid index groups.

8. The method of claim 7, wherein forming the six new kernels of electricity meters representing the six phases comprises;

grouping electricity meters having the high hybrid index into three line-to-line phase groups based on average correlations of a phase with each electricity meter;

grouping electricity meters having the low hybrid index into three line-to-neutral phase groups based on highest average correlations of a phase with each electricity meter; and forming the six new kernels of electricity meters by combining the three line-to-line phase groups and the three line-to-neutral phase groups.

9. A system comprising:

one or more processors; and memory communicatively coupled to the one or more processors, the memory storing thereon computer executable instructions that, when executed by the one or more processors, cause the one or more processors to perform operations comprising:

calculating voltage correlations of meter-to-meter combinations of a plurality of electricity meters based on voltage time series data collected over a preselected collection time period, each electricity meter of the plurality of electricity meters connected to one of six phases comprising three line-to-neutral phases and three line-to-line phases;

clustering the plurality of electricity meters into three initial kernels representing the three line-to-neutral phases based on voltage correlations;

for each of the three initial kernels, calculating correlation values with each electricity meter of the plurality of electricity meters;

determining three new kernels based on the correlation values;

clustering the plurality of electricity meters into three groups based on a hybrid index for the three new kernels calculated based on average correlation values associated with each electricity meter;

forming six new kernels of electricity meters representing the six phases based on the average correlation values associated with each electricity meter; and assigning a predicted phase to an electricity meter of the plurality of electricity meters based on corresponding correlation values of the electricity meter with each of the six new kernels based on the voltage time series data.

10. The system of claim 9, wherein the voltage time series data is, at least one of:

collected by the plurality of electricity meters, stored by the plurality of electricity meters, transmitted by the plurality of electricity meters to, and stored by, a central office of a utility service provider, or obtained from the central office.

11. The system of claim 9, wherein the voltage time series data includes a preselected analysis period of voltage data associated with an electricity meter of the plurality of electricity meters taken over a preselected collection time period at a preselected interval.

12. The system of claim 9, wherein the operations further comprise, prior to calculating the voltage correlations of meter-to-meter combinations:

omitting problematic data of the voltage time series data, wherein the problematic data include:

voltage values deviating more than a preselected value from an expected average value, constant voltage over longer than a predetermined period, missing data over more than a preselected number of preselected intervals, and data from an electricity meter having location information inconsistent with an actual geographical location of the electricity meter.

13. The system of claim 9, wherein clustering the plurality of electricity meters into the three initial kernels comprises:

determining three largest clusters of electricity meters for all clusters having at least three electricity meters and up to all electricity meters of the plurality of electricity meters;

determining a ratio of a third largest cluster size of the three largest clusters to a largest cluster size of the three largest clusters;

determining a lowest number of clusters, such that the ratio is greater than a preselected criteria;

grouping the plurality of electricity meters into the lowest number of clusters; and selecting three largest clusters as the three initial kernels.

14. The system of claim 9, wherein determining the three new kernels based on the correlation values comprises:

evaluating hybrid index values of a predetermined range for the three initial kernels, a hybrid index value calculated as a ratio of a median correlation value of the three initial kernels to a maximum correlation value of the three initial kernels;

determining a cutoff value of the hybrid index below which there are more than a first preselected number of electricity meters for each phase and above which there are more than a second preselected number of electricity meters; and selecting electricity meters with hybrid index values below the cutoff value as elements for the three new kernels.

15. The system of claim 9, wherein clustering the plurality of electricity meters into three groups comprises:
   clustering a group of electricity meters with a high hybrid index as a line-to-line phase group,
   clustering electricity meters with a low hybrid index as a line-to-neutral phase group, and
   clustering electricity meters with in-between hybrid index values as a band separating the high and low hybrid index groups.

16. The system of claim 15, wherein forming the six new kernels of electricity meters representing the six phases comprises;
   grouping electricity meters having the high hybrid index into three line-to-line phase groups based on average correlations of a phase with each electricity meter;
   grouping electricity meters having the low hybrid index into three line-to-neutral phase groups based on highest average correlations of a phase with each electricity meter; and
   forming the six new kernels of electricity meters by combining the three line-to-line phase groups and the three line-to-neutral phase groups.

17. A non-transitory computer-readable storage medium storing thereon computer executable instructions that, when executed by one or more processors of an electricity meter, cause the one or more processors to perform operations comprising:
   calculating voltage correlations of meter-to-meter combinations of a plurality of electricity meters based on voltage time series data collected over a preselected collection time period, each electricity meter of the plurality of electricity meters connected to one of six phases comprising three line-to-neutral phases and three line-to-line phases;
   clustering the plurality of electricity meters into three initial kernels representing the three line-to-neutral phases based on voltage correlations;
   for each of the three initial kernels, calculating correlation values with each electricity meter of the plurality of electricity meters;
   determining three new kernels based on the correlation values;
   clustering the plurality of electricity meters into three groups based on a hybrid index for the three new kernels calculated based on average correlation values associated with each electricity meter;
   forming six new kernels of electricity meters representing the six phases based on the average correlation values associated with each electricity meter; and
   assigning a predicted phase to an electricity meter of the plurality of electricity meters based on corresponding correlation values of the electricity meter with each of the six new kernels based on the voltage time series data.

18. The non-transitory computer-readable storage medium of claim 17, wherein the operations further comprise, prior to calculating the voltage correlations of meter-to-meter combinations:
   omitting problematic data of the voltage time series data, wherein the problematic data include:
      voltage values deviating more than a preselected value from an expected average value,
      constant voltage over longer than a predetermined period,
      missing data over more than a preselected number of preselected intervals, and
      data from an electricity meter having location information inconsistent with an actual geographical location of the electricity meter.

19. The non-transitory computer-readable storage medium of claim 17, wherein clustering the plurality of electricity meters into three groups comprises:
   clustering a group of electricity meters with a high hybrid index as a line-to-line phase group,
   clustering electricity meters with a low hybrid index as a line-to-neutral phase group, and
   clustering electricity meters with in-between hybrid index values as a band separating the high and low hybrid index groups.

20. The non-transitory computer-readable storage medium of claim 19, wherein forming the six new kernels of electricity meters representing the six phases comprises;
   grouping electricity meters having the high hybrid index into three line-to-line phase groups based on average correlations of a phase with each electricity meter;
   grouping electricity meters having the low hybrid index into three line-to-neutral phase groups based on highest average correlations of a phase with each electricity meter; and
   forming the six new kernels of electricity meters by combining the three line-to-line phase groups and the three line-to-neutral phase groups.

* * * * *